United States Patent
Zhao et al.

(10) Patent No.: US 10,894,485 B2
(45) Date of Patent: Jan. 19, 2021

(54) METHOD AND DEVICE FOR DETECTING SOC OF BATTERY

(71) Applicant: CONTEMPORARY AMPEREX TECHNOLOGY CO., LIMITED, Ningde (CN)

(72) Inventors: Ang Zhao, Ningde (CN); Yong Cheng, Ningde (CN); Xiaojun Yang, Ningde (CN); Jiming Du, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 495 days.

(21) Appl. No.: 15/638,488

(22) Filed: Jun. 30, 2017

(65) Prior Publication Data

US 2018/0001782 A1 Jan. 4, 2018

(30) Foreign Application Priority Data

Jul. 1, 2016 (CN) .......................... 2016 1 0515532

(51) Int. Cl.
*B60L 58/12* (2019.01)
*G01R 31/382* (2019.01)
(Continued)

(52) U.S. Cl.
CPC ........... *B60L 58/12* (2019.02); *B60L 11/1861* (2013.01); *B60W 20/13* (2016.01); *G01R 31/367* (2019.01); *G01R 31/382* (2019.01); *G01R 31/387* (2019.01)

(58) Field of Classification Search
CPC .... B60L 58/12; B60L 11/1861; G01R 31/367; G01R 31/382; G01R 31/387
See application file for complete search history.

(56) References Cited

U.S. PATENT DOCUMENTS 8,207,706 B2 * 6/2012 Ishikawa .............. G01R 31/367
320/132
8,645,088 B2 * 2/2014 Schaefer ........... H01M 10/4257
702/63

(Continued)

FOREIGN PATENT DOCUMENTS

| CN | 102162836 A | 8/2011 | |
| CN | 105277898 A | 1/2016 | |
| WO | WO-2016083756 A1 * | 6/2016 | ......... G01R 31/3648 |

OTHER PUBLICATIONS

English translation of WO-2016083756-A1 from google patents.*
CN Office Action dated Jun. 26, 2018 for corresponding CN Application No. 201610515532.8.

*Primary Examiner* — Mohamed Charioui
(74) *Attorney, Agent, or Firm* — Tarolli, Sundheim, Covell & Tummino LLP

(57) ABSTRACT

Embodiments of the present invention provide a method and a device for detecting SOC of a battery. The method for detecting SOC of a battery includes: determining an initial SOC value of the battery according to a waiting time of the battery; calculating a current SOC value of the battery based on the initial SOC value and a current working current of the battery, denoting as a first SOC value. In embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

8 Claims, 4 Drawing Sheets

Determining an initial SOC value of the battery according to a standing time of the battery — S101

Calculating a current SOC value of the battery on the basis of the initial SOC value and a current working current of the battery, denoting as a first SOC value — S102

(51) Int. Cl.
G01R 31/67 (2020.01)
G01R 31/387 (2019.01)
B60W 20/13 (2016.01)
G01R 31/367 (2019.01)
B60L 11/18 (2006.01)

(56) References Cited

U.S. PATENT DOCUMENTS

| | | | |
|---|---|---|---|
| 9,221,345 B2* | 12/2015 | Bito | B60L 7/14 |
| 10,191,117 B2* | 1/2019 | Imaizumi | H02J 7/0031 |
| 2012/0310568 A1* | 12/2012 | Wang | G01R 31/3842 |
| | | | 702/63 |
| 2014/0225621 A1* | 8/2014 | Kimura | G01R 31/3842 |
| | | | 324/426 |

* cited by examiner

METHOD AND DEVICE FOR DETECTING SOC OF BATTERY

CROSS-REFERENCE TO RELATED APPLICATIONS

The present application claims priority to Chinese Patent Application No. 201610515532.8, filed on Jul. 1, 2016, the content of which is incorporated herein by reference in its entirety.

TECHNICAL FIELD

The present invention relates to the field of electronic technologies and, in particular, to a method and a device for detecting SOC of a battery.

BACKGROUND

A hybrid vehicle refers to a vehicle having a vehicle driving system integrated by two or more single driving systems. The two or more single driving systems operate simultaneously. On the basis of actual driving status of the vehicle, driving power of the vehicle is supplied by a single driving system or by cooperation of two or more driving systems.

Generally, a hybrid vehicle refers to a hybrid electric vehicle (Hybrid electric vehicle, HEV), i.e., a vehicle adopting both a conventional internal combustion engine (diesel engine or gasoline engine) and an electro-motor as the power source. Some motors are modified to be able to use other types of fuel such as compressed natural gas, propane, ethanol fuel and the like.

As a result of more and more strict measures on environmental protection throughout the world, the hybrid vehicle has become a focus in vehicle research and development due to its properties of energy saving and low emission etc. The electrical power system of a hybrid vehicle includes a highly efficient and enhanced electro-motor, an electric generator and a storage battery.

State of charge (State of Charge, SOC) refers to a ratio of the remaining capacity of a storage battery after being used for a period of time or laid up for a long period of time with respect to the capacity of the storage battery after being fully charged. The SOC is generally represented in percentage and is within a range of 0-100%. "SOC=0" represents that the battery has been fully discharged, and "SOC=1" represents that the battery has been fully charged.

During use of a hybrid vehicle, it is necessary to handle the status of SOC of the battery, therefore, methods for estimating SOC of a battery of a hybrid vehicle are generally adopted in the prior art. One of them is an open-circuit current-time integration method, also called as Amper-Hour integration method. In such method, the working current of the battery is calculated by integration, so as to obtain SOC value of the battery. Due to the influence of measurement accuracy and sampling frequency, the calculation result of the open-circuit Amper-Hour integration method has certain error. Moreover, the error will accumulate with working time. Therefore, the Amper-Hour integration method cannot meet the requirements on long-term work of the battery.

Another method is a model-based closed loop algorithm. In such an algorithm, a mathematical model of the battery is established, and an actual measured value of SOC is compared with an estimated value of SOC by a Kalman filtering algorithm, so as to obtain the SOC value of the battery. However, it is hard for such a method to establish an accurate battery model and corresponding filter parameters, resulting in that the estimated SOC value has large error, in addition, this method requires a large amount of calculation resource and thus the cost is high.

It can be seen from the above that, the SOC estimating method for battery of the hybrid vehicle in the prior art has problems of large error and low estimation accuracy, which may cause the battery be overcharged/overdischarged and thus damaged, thereby bringing potential safety risk to the hybrid vehicle.

SUMMARY

An object of the present invention is to provide a method and a device for detecting SOC of a battery, so as to reduce detection error of SOC of a battery in a hybrid vehicle, and improve detection accuracy.

In order to achieve the above object, the present invention provides a method for detecting SOC of a battery, including steps of:

determining an initial SOC value of the battery according to a waiting time of the battery; and calculating a current SOC value of the battery based on the initial SOC value and a current working current of the battery, wherein the current SOC value is denoted as a first SOC value.

Further, the above method can be characterized by further including a step of:

in a situation that a preset calibration condition is met, calibrating the obtained first SOC value, so as to obtain a second SOC value.

Further, the above method can be characterized in that, the step of in a situation that a preset calibration condition is met, calibrating the obtained first SOC value, so as to obtain a second SOC value, includes steps of:

measuring a voltage Vb of the battery when an absolute value of the current working current of the battery does not exceed 1C;

searching for an SOC value corresponding to the voltage Vb from a preset correspondence table of open-circuit voltage and SOC, wherein the searched SOC value is denoted as SCOcr; and under a condition that the current working current is positive and the first SOC value is smaller than the SOCcr, or the current working current is negative and the first SOC value is greater than the SOCcr, taking the SOCcr as the second SOC value.

Further, the above method can be characterized by further including steps of:

judging whether the battery is in an open-circuit state; and under a condition that the battery is in an open-circuit state, saving the current SOC value and starting timing of the waiting time of the battery.

Further, the above method can be characterized in that, the step of determining an initial SOC value of the battery according to a waiting time of the battery includes a step of:

when the waiting time of the battery exceeds a preset waiting time threshold, searching for an SOC value corresponding to a current open-circuit voltage of the battery from a preset correspondence table of open-circuit voltage and SOC, wherein the searched SOC value is taken as the initial SOC value.

Further, the above method can be characterized in that, the step of determining an initial SOC value of the battery according to a waiting time of the battery includes a step of:

when the waiting time of the battery does not exceed a preset waiting time threshold, taking an SOC value corresponding to a latest switch-off operation of a main switch of the battery as the initial SOC value.

Further, the above method can be characterized in that, a calculation formula of the first SOC value is:

$$SOC_{n+1} = Iw*t*100\%/Cb + SOC_n,$$

wherein $SOC_n$ represents an SOC value obtained from a $n^{th}$ calculation, $SOC_{n+1}$ represents an SOC value obtained from $n+1^{th}$ calculation, Iw represents a working current of the battery, t represents a sampling interval of Iw, Cb represents a capacity of the battery, symbol "*" represents a multiply operation, symbol "/" represents a division operation, n is a non-negative integer, $SOC_0$ is the initial SOC value.

In the method for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

In order to achieve the above object, the present invention further provides a device for detecting SOC of a battery, including:

a determining module, configured to determine an initial SOC value of the battery according to a waiting time of the battery; and a calculating module, configured to calculate a current SOC value of the battery based on the initial SOC value and a current working current of the battery, wherein the calculated current SOC value is denoted as a first SOC value.

Further, the above device can be characterized by further including:

a calibrating module, configured to, in a situation that a preset calibration condition is met, calibrate the obtained first SOC value, so as to obtain a second SOC value.

Further, the above device can be characterized in that, the calibrating module further includes:

a measuring unit, configured to measure a voltage Vb of the battery when an absolute value of the current working current of the battery does not exceed 1C;

a searching unit, configured to search for an SOC value corresponding to the voltage Vb from a preset correspondence table of open-circuit voltage and SOC, wherein the searched SOC value is denoted as SCOcr; and a calibrating unit, configured to, under a condition that the current working current is positive and the first SOC value is smaller than the SOCcr, or the current working current is negative and the first SOC value is greater than the SOCcr, take the SOCcr as the second SOC value.

Further, the above device can be characterized by further including:

a judging module, configured to judge whether the battery is in an open-circuit state; and a storing and timing module, configured to, under a condition that the battery is in an open-circuit state, save the current SOC value and start timing of the waiting time of the battery.

Further, the above device can be characterized in that, the determining module further includes:

a first determining unit, configured to, when the waiting time of the battery exceeds a preset waiting time threshold, search for an SOC value corresponding to a current open-circuit voltage of the battery from a preset correspondence table of open-circuit voltage and SOC, wherein the searched SOC value is taken as the initial SOC value.

Further, the above device can be characterized in that, the determining module further includes:

a second determining unit, configured to, when the waiting time of the battery does not exceed a preset waiting time threshold, take an SOC value corresponding to a latest switch-off operation of a main switch of the battery as the initial SOC value.

Further, the above device can be characterized in that, a calculation formula of the first SOC value is:

$$SOC_{n+1} = Iw*t*100\%/Cb + SOC_n,$$

wherein $SOC_n$ represents an SOC value obtained from a $n^{th}$ calculation, $SOC_{n+1}$ represents an SOC value obtained from $n+1^{th}$ calculation, Iw represents a working current of the battery, t represents a sampling interval of Iw, Cb represents a capacity of the battery, symbol "*" represents a multiply operation, symbol "/" represents a division operation, n is a non-negative integer, $SOC_0$ is the initial SOC value.

In the device for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

In order to achieve the above object, the present invention further provides a battery management system, including any one of the above devices for detecting SOC of a battery.

In the battery management system according to embodiments of the present invention, a device for detecting SOC of the battery is included, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

BRIEF DESCRIPTION OF DRAWINGS

In order to more clearly illustrate technical solutions of embodiments of the present invention, the accompanying drawings used in the embodiments will be briefly introduced hereinafter. Obviously, the drawings described are only some of the embodiments of the present invention, on the basis of these drawings, those skilled in the art can also obtain other drawings without creative efforts.

DESCRIPTION OF EMBODIMENTS

Principles and characteristics of the present invention will be described with reference to the drawings. It should be noted that, the embodiments illustrated as below are only used to explain the present invention, rather than limit the scope of the present invention. For those skilled in the art, all embodiments obtained within inventive spirit of the present invention without creative efforts shall belong to the protection scope of the present invention.

Embodiment One

Figure 1:
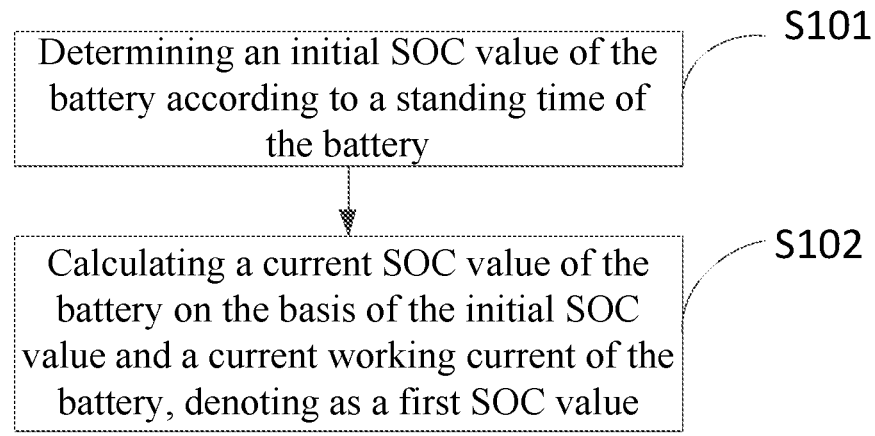
FIG. 1 is a flow diagram of a method for detecting SOC of a battery according to Embodiment One of the present invention.

FIG. 1 is a flow diagram of a method for detecting SOC of a battery according to Embodiment One of the present invention. As shown in FIG. 1, in the present embodiment, the method for detecting SOC of a battery can include:

step S101, determining an initial SOC value of the battery according to a waiting time of the battery.

In an embodiment of the present invention, step S101 can include: when the waiting time of the battery exceeds a preset waiting time threshold, searching for an SOC value corresponding to a current open-circuit voltage of the battery from a preset correspondence table of open-circuit voltage and SOC, and taking the searched SOC value as the initial SOC value.

The preset waiting time can be set as 1 hour. In other embodiments of the present invention, the waiting time can also be set as other values according to practical demands.

In the present invention, the open-circuit voltage of the battery is abbreviated as OCV, and the correspondence table of the open-circuit voltage and the SOC is abbreviated as OCV-SOC table. Such a table is preset according to experimental data or preset according to experience.

In an embodiment of the present invention, step S101 can include: when the waiting time of the battery does not exceed a preset waiting time threshold, taking an SOC value corresponding to a latest switch-off operation of a main switch of the battery as the initial SOC value.

The main switch refers to a switch which can put the battery in an open-circuit state. When the main switch of the battery is switched off, the battery is in an open-circuit state; when the main switch of the battery is switched on, the battery is in a connected state.

From step S101, it can be seen that, in embodiments of the present invention, when the battery satisfies the waiting condition (i.e., in the present invention, the waiting time of the battery exceeds the preset waiting time threshold), an accurate correction is conducted to the SOC value of the battery, so as to improve accuracy of the initial SOC value, and reduce error of the SOC detection result, thereby increasing accuracy of the SOC detection result.

Step S102, calculating a current SOC value of the battery on the basis of the initial SOC value and a current working current of the battery, and denoting the obtained current SOC value of the battery as a first SOC value.

The calculation formula of the first SOC value can be:

$$SOC_{n+1} = Iw*t*100\%/Cb + SOC_n$$

In the formula, $SOC_n$ represents an SOC value obtained from a $n^{th}$ calculation, $SOC_{n+1}$ represents an SOC value obtained from $n+1^{th}$ calculation, Iw represents the working current of the battery, t represents the sampling interval of Iw, Cb represents the capacity of the battery, symbol "*" represents a multiplication operation, symbol "/" represents a division operation, n is a nonnegative integer, $SOC_0$ is the initial SOC value determined in step S101.

A final SOC value can be obtained by performing loop computation using the formula $SOC_{n+1} = Iw*t*100\%/Cb + SOC_n$ until the working current Iw=0, and Iw=0 means the main switch of the battery is switched off. The SOC value is updated at intervals of t.

Historical working current of the battery has significant influence on the current voltage of the battery, therefore, the current voltage of the battery is judged by the historical working current of the battery.

When the absolute value of Iw is greater than 10C (C represents the rate of current during charge or discharge of a battery; similarly hereinafter), it represents that the battery is in a large current working state. The state of the battery, that is, whether the battery is under charging or discharging, can be determined by the direction Id of the current Iw, which is closely related to the polarization effect of the battery. If Iw>0, the direction Id of the current is set as positive, if Iw<0, the direction Id of the current is set as negative.

When the absolute value of Iw is not greater than 5C, it represents that the current working state of the battery will not cause big influence to the voltage properties of the battery, and the setting of Id does not need to be changed, which shows that the previous large current working state caused big influence to the voltage properties of the battery.

From step S102, it can be seen that, in embodiments of the present invention, the SOC value of the battery is calculated by accumulating the current of the battery. Since the amount of accumulation for each time is obtained according to a real-time measured current Iw, and the accumulation process is divided into sections according to the sampling interval t, so that the error of the SOC detection result can be reduced, thereby increasing accuracy of the SOC detection result.

In the whole procedure of the method for detecting SOC of the battery according to embodiments of the present invention, it is not needed to perform parameter calibration for different battery systems, thus the method is easy to be implemented, thereby reducing detection cost. Moreover, the method for detecting SOC of the battery according to embodiments of the present invention does not have accumulation of error, and thus has high accuracy of SOC detection result.

In the method for detecting SOC of a battery according to embodiments of the present invention, the current of the battery is real-time measured and the SOC value of the battery is detected by accumulating the current of the battery, in addition, the initial SOC value is calibrated by the waiting time, so that the error of the SOC detection result is reduced, thereby increasing accuracy of the SOC detection result.

Embodiment Two

Figure 2:
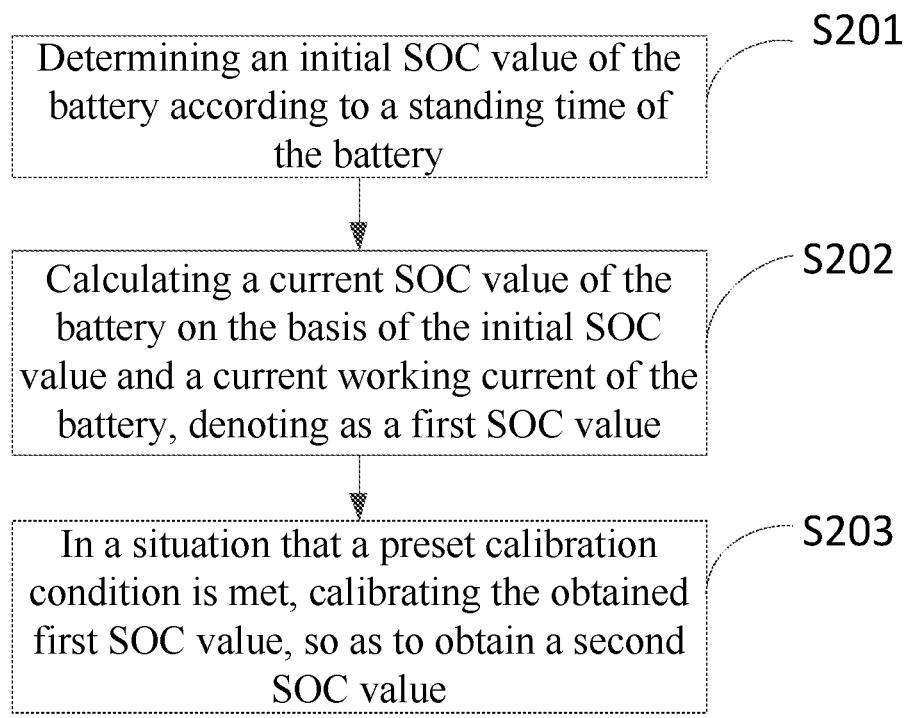
FIG. 2 is a flow diagram of a method for detecting SOC of a battery according to Embodiment Two of the present invention.

FIG. 2 is a flow diagram of a method for detecting SOC of a battery according to Embodiment Two of the present invention. As shown in FIG. 2, in the present embodiment, the method for detecting SOC of a battery can include:

step S201, determining an initial SOC value of the battery according to a waiting time of the battery;

step S202, calculating a current SOC value of the battery on the basis of the initial SOC value and a current working current of the battery, denoting the obtained current SOC value of the battery as a first SOC value.

The steps S201 and S202 are identical to the previous steps S101 and S102, respectively; and relevant principles can be referred to the illustration for steps S101 and S102, which will not be repeated herein.

Step S203, in a situation that a preset calibration condition is met, calibrating the obtained first SOC value, so as to obtain a second SOC value.

Through step S203, in embodiments of the present invention, the SOC detection result can be calibrated during working of the battery, so as to further reduce error of the SOC detection result, thereby increasing accuracy of the SOC detection result.

In embodiments of the present invention, step S203 can include the following sub-steps:

measuring a voltage Vb of the battery when an absolute value of the current working current of the battery does not exceed 1C;

searching for an SOC value corresponding to the voltage Vb from the preset correspondence table of open-circuit voltage and SOC, and denoting the searched SOC value as SOCcr; and under a condition that the current working current is positive and the first SOC value is smaller than the SOCcr, or the current working current is negative and the first SOC value is greater than the SOCcr, taking the SOCcr as the second SOC value.

Since the internal resistance of the battery is small, when the working current of the battery is small (e.g. absolute value of the working current is not greater than 1C in the present invention), polarization effect of the battery is ignored, then it is considered that the current working voltage of the battery is approximately equal to the open-circuit voltage of the battery. That is, when the absolute value of the working current Iw of the battery is equal to or smaller than 1C, the voltage Vb of the battery is measured by a voltage sensor, and the SOCcr value is acquired by searching for the OCV-SOC table using Vb. Then, the SOCcr value is used to calibrate the first SOC value.

The polarization effect of the battery is relevant to the working current of the battery. If the battery has been subjected to discharging with a large current, the current voltage will be smaller than the voltage corresponding to the actual SOC state of the battery due to the polarization effect. Therefore, theoretically, the SOC value obtained from the current voltage is smaller than the actual SOC value. As a result, if Id is positive and SOC<SOCcr, or Id is negative and SOC>SOCcr, the SOC value will be replaced by the SOCcr value, and the SOCcr value is a calibrated SOC value, denoted as the second SOC value.

In the method for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result. Moreover, by using the method for detecting SOC of a battery according to embodiments of the present invention, the SOC detection result can be calibrated during working of the battery, so as to further reduce error of the SOC detection result, thereby further increasing accuracy of the SOC detection result.

Embodiment Three

Figure 3:
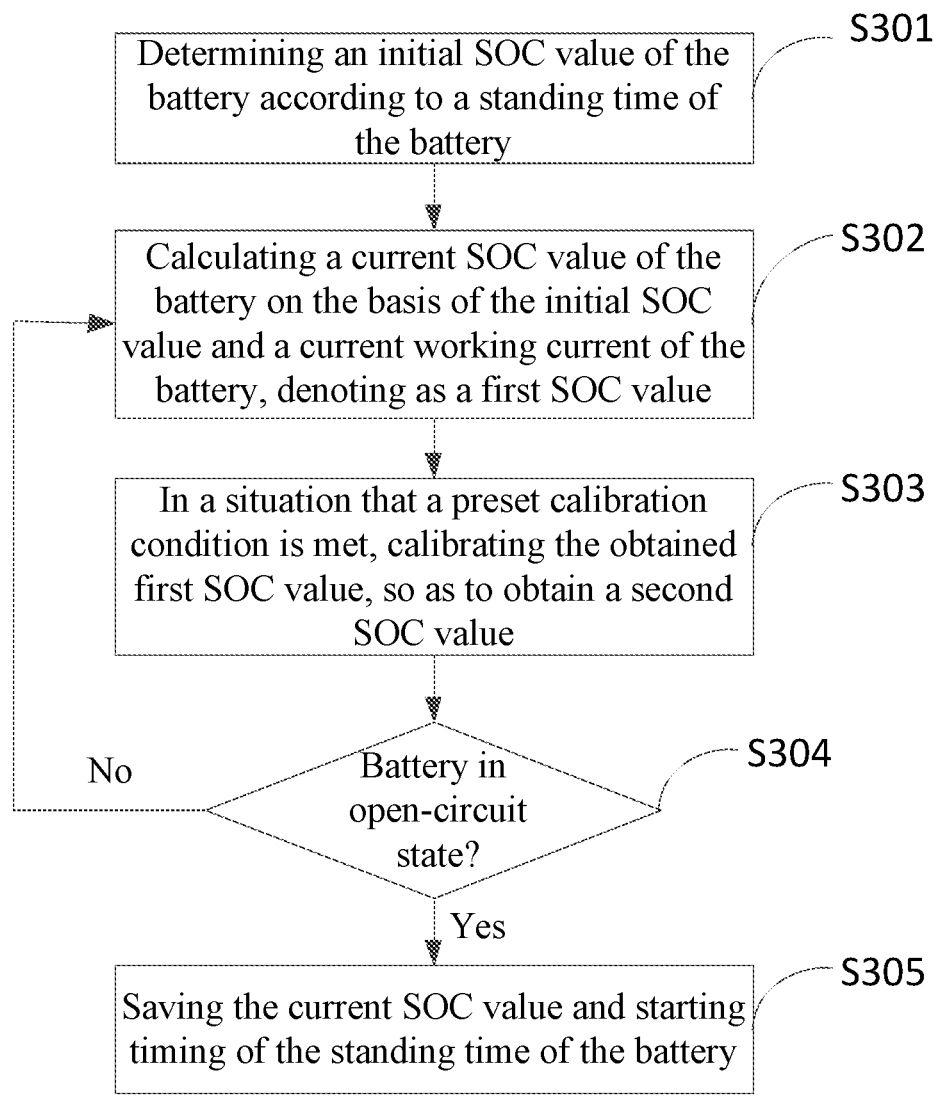
FIG. 3 is a flow diagram of a method for detecting SOC of a battery according to Embodiment Three of the present invention.

FIG. 3 is a flow diagram of a method for detecting SOC of a battery according to Embodiment Three of the present invention. As shown in FIG. 3, in the present embodiment, the method for detecting SOC of a battery can include:

Step S301, determining an initial SOC value of the battery according to a waiting time of the battery;

step S302, calculating a current SOC value of the battery on the basis of the initial SOC value and a current working current of the battery, denoting the obtained current SOC value of the battery as a first SOC value;

step S303, in a situation that a preset calibration condition is met, calibrating the obtained first SOC value, so as to obtain a second SOC value;

step S304, judging whether the battery is in an open-circuit state, if yes, then executing step S305, if no, returning to step S302; and step S305, under a condition that the battery is in an open-circuit state, saving the current SOC value and starting timing of the waiting time of the battery.

When the battery is in an open-circuit state (i.e., the main switch is switched off), the final SOC value is stored into a nonvolatile memory, and timing of the waiting time of the battery is started. The stored SOC value and the waiting time can be used to determine an initial SOC value when next time detecting SOC of the battery, and the determination of the initial SOC value can be referred to step S301.

In the method for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result. Moreover, by using the method for detecting SOC of a battery according to embodiments of the present invention, the SOC detection result can be calibrated during working of the battery, so as to further reduce error of the SOC detection result, thereby further increasing accuracy of the SOC detection result. Furthermore, by using the method for detecting SOC of a battery according to embodiments of the present invention, under the condition that the battery is in an open-circuit state, the current SOC value is saved and timing of the waiting time of the battery is started, so as to guarantee accuracy of the next SOC detection.

In order to implement the method for detecting SOC of a battery described in above embodiments, the present invention further provides embodiments on a device for detecting SOC of a battery.

Embodiment Four

Figure 4:
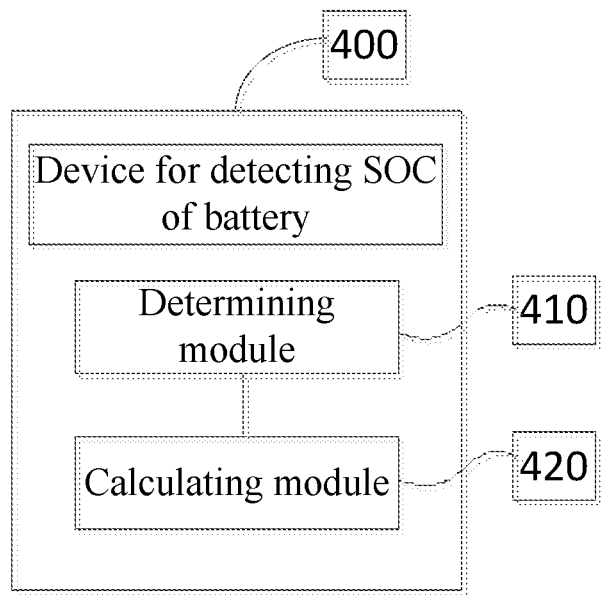
FIG. 4 is a structural block diagram of a device for detecting SOC of a battery according to Embodiment Four of the present invention.

FIG. 4 is a structural block diagram of a device for detecting SOC of a battery according to Embodiment Four of the present invention. The device for detecting SOC of a battery according to embodiments of the present invention can be used to implement the method for detecting SOC of a battery according to embodiments shown in FIG. 1.

As shown in FIG. 4, in the present embodiment, the device 400 for detecting SOC of a battery can include a determining module 410 and a calculating module 420. The determining module 410 is configured to determine an initial SOC value of the battery according to a waiting time of the battery. The calculating module 420 is configured to calculate a current SOC value of the battery on the basis of the initial SOC value and a current working current of the battery, and the calculated current SOC value is denoted as a first SOC value.

In embodiments of the present invention, the determining module 410 can include a first determining unit. The first determining unit is configured to, when the waiting time of the battery exceeds a preset waiting time threshold, search for an SOC value corresponding to a current open-circuit voltage of the battery from a preset correspondence table of open-circuit voltage and SOC, and take the searched SOC value as the initial SOC value.

In embodiments of the present invention, the determining module 410 can include a second determining unit. The second determining unit is configured to, when the waiting time of the battery does not exceed a preset waiting time threshold, take an SOC value corresponding to a latest switch-off operation of a main switch of the battery as the initial SOC value.

The calculation formula of the first SOC value is:

$$SOC_{n+1} = Iw*t*100\%/Cb + SOC_n.$$

In the formula, $SOC_n$ represents an SOC value obtained from a $n^{th}$ calculation, $SOC_{n+1}$ represents an SOC value obtained from $n+1^{th}$ calculation, Iw represents the working current of the battery, t represents the sampling interval of Iw, Cb represents the capacity of the battery, symbol "*" represents a multiplication operation, symbol "/" represents a division operation, n is a nonnegative integer, $SOC_0$ is the initial SOC value.

Since the device for detecting SOC of a battery according to embodiments of the present invention can be used to implement the method for detecting SOC of a battery illustrated in embodiments shown in FIG. 1, the illustration of the device for detecting SOC of a battery can be referred to the illustration of the method for detecting SOC of a battery according to embodiments shown in FIG. 1, which will not be repeated herein.

In the device for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

Embodiment Five

Figure 5:
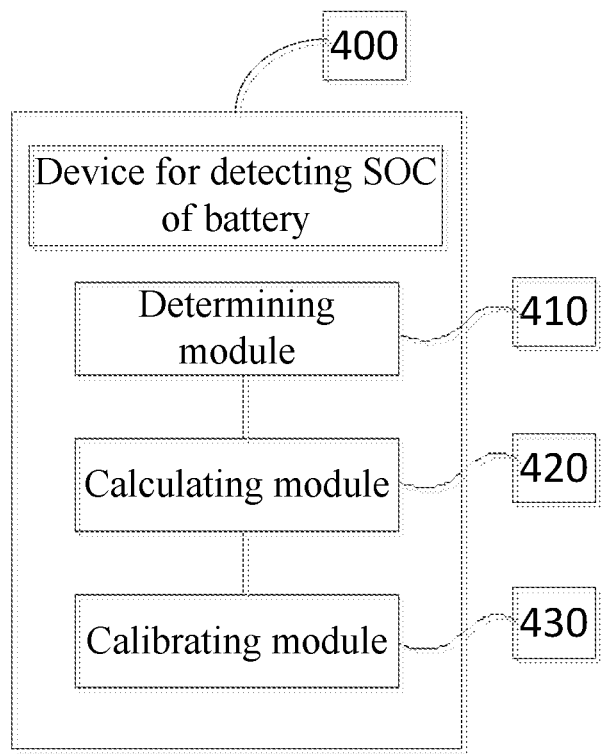
FIG. 5 is a structural block diagram of a device for detecting SOC of a battery according to Embodiment Five of the present invention.

FIG. 5 is a structural block diagram of a device for detecting SOC of a battery according to Embodiment Five of the present invention. The device for detecting SOC of a battery according to embodiments of the present invention can be used to implement the method for detecting SOC of a battery according to embodiments shown in FIG. 2.

As shown in FIG. 5, in the present embodiment, the device 400 for detecting SOC of a battery can include a determining module 410, a calculating module 420 and a calibrating module 430. The determining module 410 is configured to determine an initial SOC value of the battery according to a waiting time of the battery. The calculating module 420 is configured to calculate a current SOC value of the battery on the basis of the initial SOC value and a current working current of the battery, and the calculated current SOC value of the battery is denoted as a first SOC value. The calibrating module 430 is configured to, in a situation that a preset calibration condition is met, calibrate the obtained first SOC value, so as to obtain a second SOC value.

In embodiments of the present invention, the calibrating module 430 can include a measuring unit, a searching unit and a calibrating unit. The measuring unit is configured to measure a voltage Vb of the battery when an absolute value of a current working current of the battery does not exceed 1C. The searching unit is configured to search for an SOC value corresponding to the voltage Vb from a preset correspondence table of open-circuit voltage and SOC, and the searched SOC value is denoted as SCOcr. The calibrating unit is configured to, under a condition that the current working current is positive and the first SOC value is smaller than the SOCcr, or the current working current is negative and the first SOC value is greater than the SOCcr, take the SOCcr as the second SOC value.

Since the device for detecting SOC of a battery according to embodiments of the present invention can be used to implement the method for detecting SOC of a battery illustrated in embodiments shown in FIG. 2, the illustration of the device for detecting SOC of a battery can be referred to the illustration of the method for detecting SOC of a battery according to embodiments shown in FIG. 2, which will not be repeated herein.

In the device for detecting SOC of a battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result. Moreover, the device for detecting SOC of a battery according to embodiments of the present invention can further calibrate the SOC detection result during the working of the battery, so as to further reduce error of the SOC detection result, and further improve accuracy of the SOC detection result.

Embodiment Six

Figure 6:
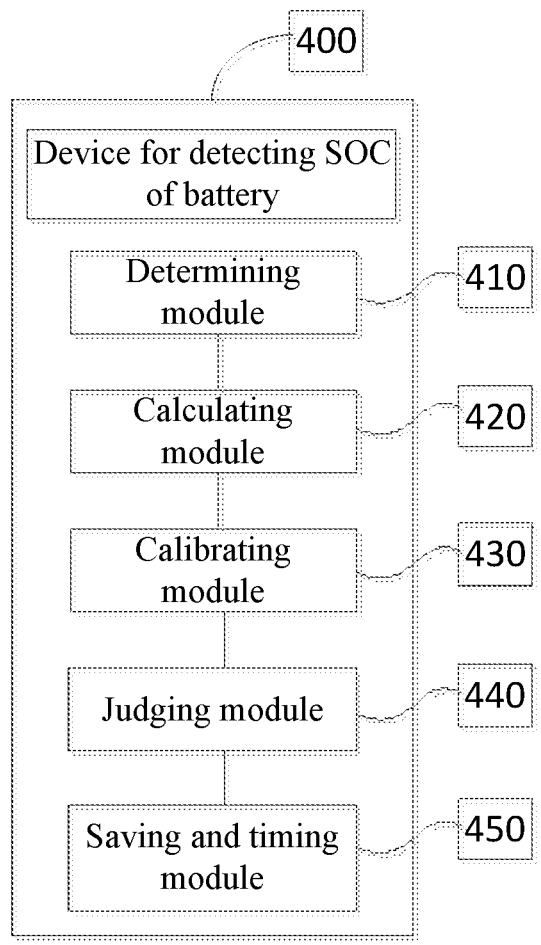
FIG. 6 is a structural block diagram of a device for detecting SOC of a battery according to Embodiment Six of the present invention.

FIG. 6 is a structural block diagram of a device for detecting SOC of a battery according to Embodiment Six of the present invention. The device for detecting SOC of a battery according to embodiments of the present invention can be used to implement the method for detecting SOC of a battery according to embodiments shown in FIG. 3.

As shown in FIG. 6, in the present embodiment, the device 400 for detecting SOC of a battery can include a determining module 410, a calculating module 420, a calibrating module 430, a judging module 540 and a storing and timing module 550. The determining module 410 is configured to determine an initial SOC value of the battery according to a waiting time of the battery. The calculating module 420 is configured to calculate a current SOC value of the battery on the basis of the initial SOC value and a current working current of the battery, and the calculated current SOC value is denoted as a first SOC value. The calibrating module 430 is configured to, in a situation that a preset calibration condition is met, calibrate the obtained first SOC value, so as to obtain a second SOC value. The judging module 540 is configured to judge whether the battery is in an open-circuit state. The storing and timing module 550 is configured to, under a condition that the battery is in an open-circuit state, save the current SOC value and start timing of the waiting time of the battery.

Since the device for detecting SOC of a battery according to embodiments of the present invention can be used to implement the method for detecting SOC of a battery illustrated in embodiments shown in FIG. 3, the illustration of the device for detecting SOC of a battery can be referred to the illustration of the method for detecting SOC of a battery according to embodiments shown in FIG. 3, which will not be repeated herein.

In the device for detecting SOC of the battery according to embodiments of the present invention, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result. Moreover, the device for detecting SOC of a battery according to embodiments of the present invention can calibrate the SOC detection result during the working of the battery, so as to further reduce error of the SOC detection result, and further improve accuracy of the SOC detection result. Furthermore, by using the device for detecting SOC of a battery in the embodiment, under the condition that the battery is in an open-circuit state, the current SOC value is saved and timing of the waiting time of the battery is started, so as to guarantee accuracy of the next SOC detection.

Embodiment Seven

Figure 7:
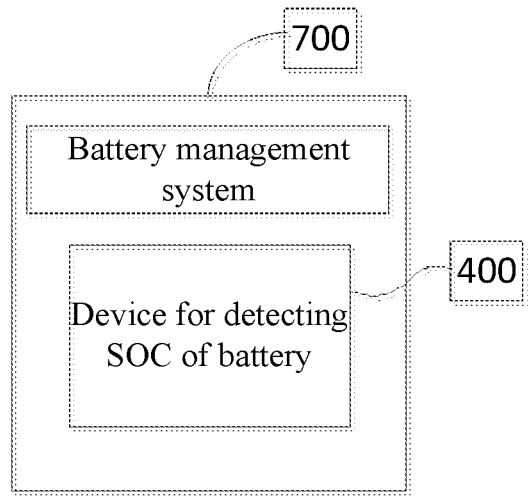
FIG. 7 is a structural block diagram of a battery management system according to Embodiment Seven of the present invention.

Embodiments of the present invention further provide a battery management system. FIG. 7 is a structural block diagram of a battery management system according to Embodiment Seven of the present invention. As shown in FIG. 7, in the present embodiment, the battery management system 700 can include the device 400 for detecting SOC of a battery. The device 400 for detecting SOC of a battery can be any one of the devices for detecting SOC of a battery in the above-described embodiments.

In the battery management system according to embodiments of the present invention, a device for detecting SOC of the battery is included, the current of the battery is real-time measured and the SOC value of the battery is calculated by accumulating the current of the battery, in addition, the initial SOC value is calibrated by the waiting time, so that the error of the SOC detection result is reduced, thereby increasing accuracy of the SOC detection result.

The above described embodiments are merely preferred embodiments of the present invention, which cannot limit the present invention. Any modification, equivalent replacement and improvement made within the spirit and principle of the present invention shall fall into the protection scope of the present invention.

What is claimed is:

1. A method for detecting state of charge (SOC) of a battery, comprising:
determining, by a battery management system, an initial SOC value of the battery according to a current open-circuit voltage of the battery, when a waiting time of the battery exceeds a preset waiting time threshold;
measuring, by the battery management system, a current working current of the battery; and
calculating, by the battery management system, a first SOC value of the battery based on the initial SOC value and the current working current of the battery,
wherein the method for detecting SOC of the battery further comprises:
measuring, by battery management system, a voltage (Vb) of the battery when an absolute value of the current working current of the battery does not exceed 1C;
searching, by the battery management system, for an SOC value corresponding to the voltage (Vb) from a preset correspondence table of open-circuit voltage and SOC, and denoting, by the battery management system, the searched SOC value as SCOcr; and under a condition that the current working current is positive and the first SOC value is smaller than the SOCcr, or the current working current is negative and the first SOC value is greater than the SOCcr, taking, by the battery management system, the SOCcr as a second SOC value, and replacing the first SOC value with the second SOC.

2. The method for detecting SOC of a battery according to claim 1, further comprising:
judging, by the battery management system, whether the battery is in an open-circuit state; and
under a condition that the battery is in the open-circuit state, saving, by the battery management system, the first SOC value and timing the waiting time of the battery.

3. The method for detecting SOC of a battery according to claim 1, further comprising:
when the waiting time of the battery does not exceed the preset waiting time threshold, taking, by the battery management system the first SOC of the battery saved as the initial SOC value.

4. The method for detecting SOC of a battery according to claim 1, wherein the first SOC value is calculated in accordance with a calculation formula:

$$SOC_{n+1}=Iw*t*100\%/Cb+SOC_n,$$

wherein $SOC_n$ represents an SOC value obtained from a $n^{th}$ calculation, $SOC_{n+1}$ represents an SOC value obtained from a $n+1^{th}$ calculation, Iw represents a working current of the battery, t represents a sampling interval of Iw, Cb represents a capacity of the battery, symbol "*" represents a multiplication operation, symbol "/" represents a division operation, n is a non-negative integer, $SOC_n$ is $SOC_0$ when n is equal to 0, and the $SOC_0$ is the initial SOC value.

5. A battery management system, comprising:
at least one processor, and
a memory communicatively coupled to the at least one processor,
wherein the memory stores instructions executed by the at least one processor, the instructions being configured to:
determine an initial SOC value of the battery according to a current open-circuit voltage of the battery, when a waiting time of the battery exceeds a preset waiting time threshold;
measure a current working current of the battery; and
calculate a first SOC value of the battery based on the initial SOC value and the current working current of the battery;
wherein the instructions are further configured to:
measure a voltage (Vb) of the battery when an absolute value of the current working current of the battery does not exceed 1C;
search, by the battery management system, for an SOC value corresponding to the voltage (Vb) from a preset correspondence table of open-circuit voltage and SOC, and denote, by the battery management system, the searched SOC value as SCOcr; and under a condition that the current working current is positive and the first SOC value is smaller than the SOCcr, or the current working current is negative and the first SOC value is greater than the SOCcr, take the SOCcr as a second SOC value, and replace the first SOC value with the second SOC.

6. The battery management system according to claim 5, wherein the first SOC value is calculated in accordance with a calculation formula:

$$SOC_{n+1}=Iw*t*100\%/Cb+SOC_n,$$

wherein $SOC_n$ represents an SOC value obtained from a $n^{th}$ calculation, $SOC_{n+1}$ represents an SOC value obtained from a $n+1^{th}$ calculation, Iw represents a working current of the battery, t represents a sampling interval of Iw, Cb represents a capacity of the battery, symbol "*" represents a multiplication operation, symbol "/" represents a division operation, n is a non-negative integer, $SOC_n$ is $SOC_0$ when n is equal to 0, and the $SOC_0$ is the initial SOC value.

7. The battery management system according to claim 5, wherein the instructions are further configured to:
   judge whether the battery is in an open-circuit state; and
   under a condition that the battery is in the open-circuit state, save the first SOC value and timing the waiting time of the battery.

8. The battery management system according to claim 5, wherein the instructions are further configured to:
   when the waiting time of the battery does not exceed the preset waiting time threshold, take the first SOC of the battery saved as the initial SOC value.

* * * * *